United States Patent
Schneegans et al.

(10) Patent No.: US 7,757,390 B2
(45) Date of Patent: Jul. 20, 2010

(54) METHOD FOR PRODUCTION OF A SEMICONDUCTOR COMPONENT

(75) Inventors: Manfred Schneegans, Vaterstetten (DE); Karsten Guth, Soest (DE); Ivan Galesic, Regensburg (DE)

(73) Assignee: Infineon Techologies AG, Neubiberg (DE)

( * ) Notice: Subject to any disclaimer, the term of this patent is extended or adjusted under 35 U.S.C. 154(b) by 393 days.

(21) Appl. No.: 11/759,267

(22) Filed: Jun. 7, 2007

(65) Prior Publication Data

US 2008/0005893 A1    Jan. 10, 2008

(30) Foreign Application Priority Data

Jun. 7, 2006    (DE) .................. 10 2006 026 799

(51) Int. Cl.
*H05K 3/30* (2006.01)
*B23K 37/00* (2006.01)

(52) U.S. Cl. ................ 29/832; 29/740; 29/840; 228/44.7; 228/54; 257/783

(58) Field of Classification Search ............ 29/740, 29/832, 840; 228/44.7, 54; 257/783
See application file for complete search history.

(56) References Cited

U.S. PATENT DOCUMENTS

| 4,875,279 | A | | 10/1989 | Sakiadis |
| 5,373,731 | A | * | 12/1994 | Tanaka et al. .............. 73/104 |
| 5,425,491 | A | * | 6/1995 | Tanaka et al. ............. 228/44.7 |
| 6,640,423 | B1 | | 11/2003 | Johnson et al. |
| 7,327,041 | B2 | * | 2/2008 | Dotta et al. ................ 257/783 |
| 2005/0221582 | A1 | * | 10/2005 | Lee et al. ................... 438/455 |

* cited by examiner

*Primary Examiner*—C. J Arbes
(74) *Attorney, Agent, or Firm*—Edell, Shapiro & Finnan, LLC

(57) ABSTRACT

A bonding head includes a pressure plate to press a component (e.g., a semiconductor chip) onto a substrate. The pressure plate includes a holding surface configured to hold the component and to allow the component to be pressed uniformly onto the substrate, thus allowing a particularly reliable connection. The bonding head can further include an apparatus configured to vary the curvature of the holding surface of the pressure plate.

6 Claims, 1 Drawing Sheet

METHOD FOR PRODUCTION OF A SEMICONDUCTOR COMPONENT

CROSS REFERENCE TO RELATED APPLICATIONS

This application claims priority under 35 U.S.C. §119 to Application No. DE 102006026799.0 filed on Jun. 7, 2006, entitled "Bonding Head, Bonding Tool and Method for Production of a Semiconductor Component," the entire contents of which are hereby incorporated by reference.

FIELD OF THE INVENTION

The invention relates to a bonding head and to a bonding tool having a bonding head for chip bonding. It also relates to a method for producing a semiconductor component.

BACKGROUND

The bonding of sawn semiconductor chips onto substrates such as leadframes, DCB substrates or flanges is carried out using a bonding tool which typically sucks up the semiconductor chip using a pick-and-place process, takes it off the sawing film, places it at the intended position on the substrate, and pushes it on. The mechanical and possibly electrical connection between the semiconductor chip and the substrate is produced by adhesive bonding, sintering or soldering. By way of example, one such bonding tool is described in U.S. Pat. No. 6,640,423.

One problem in this case is that the surface of the substrate is not ideally flat, by virtue of its production, but has a curvature whose intensity and direction are not, however, always reproducibly the same. This curvature of the substrate leads to non-uniform contact between the semiconductor chip and substrate, and to the semiconductor chip not being pressed on correctly in places, during the bonding process. This results, for example, in a soldered joint between the chip rear face and the substrate being incomplete and inclined, in particular adjacent to the outer edges of the semiconductor chip. A uniform, robust connection between the chip rear face and the substrate is of major importance for the reliability of a component.

SUMMARY

The present invention provides a bonding head and a bonding tool which allow a component (e.g., a semiconductor chip) to be pressed uniformly onto the substrate, and thus allow a uniform connection between the component and the substrate.

The present invention further provides a method for producing a device (e.g., semiconductor devices) having uniform, robust connections between components (e.g., semiconductor chips) and a substrate.

As described herein, a bonding head comprises a pressure plate configured to press a component onto a substrate. The pressure plate includes a holding surface which is configured to hold the component. In addition, the bonding head can include an apparatus configured to vary the curvature of the holding surface of the pressure plate.

As further described herein, a method comprises forming a device with a component secured to a substrate. A component is provided including a rear surface to be mounted on a substrate and a front surface. A substrate configured to hold the semiconductor chip is also provided. The component is held by a bonding tool including a bonding head, and with the front surface of the component resting on a holding surface of a pressure plate of the bonding head. The rear surface of the component is then pressed onto the substrate with a curvature of the holding surface of the pressure plate being matched to any curvature of the substrate, and the rear surface of the component is connected to the substrate.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
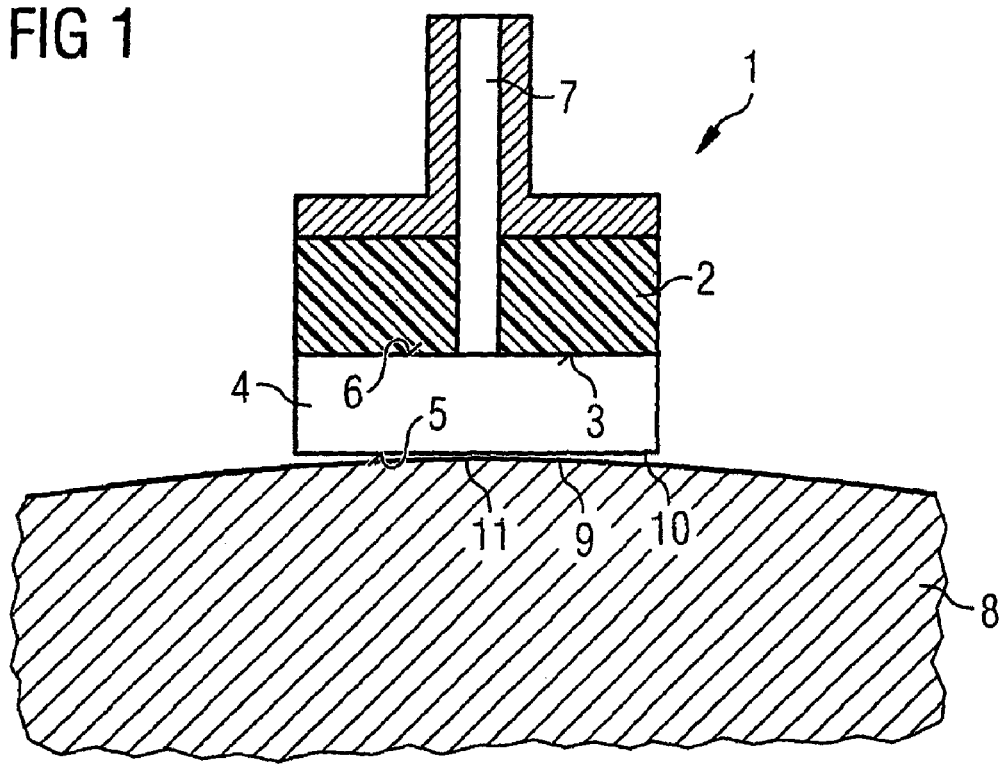
FIG. 1 shows a schematic cross section through a bonding head.

A bonding head comprises a pressure plate for pressing a component onto a substrate. The pressure plate includes a holding surface which is configured to hold the component. The bonding head can further include an apparatus which varies the curvature of the surface of the pressure plate.

In an exemplary embodiment, the component is a semiconductor chip. The rear face of the semiconductor chip is intended to be parallel to the surface of the substrate during the bonding process, in order to allow the semiconductor chip to be pressed on uniformly. Since, by virtue of the production technique, it is not possible to produce ideally flat substrates, the semiconductor chip should be curved during the bonding process such that its curvature corresponds to that of the substrate.

This can be achieved particularly easily by matching the curvature of the pressure plate, on whose surface the semiconductor chip is located, to that of the substrate.

The curvature of the surface of the pressure plate can be varied piezoelectrically. For this purpose, for example, the pressure plate may be composed of a piezoceramic material, with the pressure plate having a voltage supply. The curvature of the pressure plate can be varied very quickly and easily by the polarity and the magnitude of the supply voltage. For example, it is possible to match the curvature of the surface of the pressure plate precisely to any curvature of the substrate.

The curvature of the surface of the pressure plate can advantageously be varied locally such that the semiconductor chip can also be pressed uniformly onto a substrate with non-uniform curvature. In this context, local variation of the curvature means a variation whose area is small in comparison to the total area of the semiconductor chip and allows a plurality of curvatures with different directions and magnitudes to be introduced over the entire area of the semiconductor chip.

A bonding tool having a bonding head such as this advantageously has a device for producing a reduced pressure, which presses the front face of the semiconductor chip against the surface of the pressure plate, that is to say "sucks it up", thus allowing it to be used in a pick-and-place process.

The bonding head facilitates a secure, uniform connection to be produced between the semiconductor chip and the substrate in a simple manner. It can also be used with existing bonding tools and can be replaced by a conventional bonding head. It allows a contact force which is controlled precisely and optimally at each point on the contact surface, so as to allow uniform contact pressure even with irregularly curved substrates. It is thus possible to avoid locally excessive contact pressure, which can lead to damage to the semiconductor chip, or locally excessively light contact pressure, which results in an inadequate connection between the semiconductor chip and the substrate.

An exemplary method comprises producing a semiconductor chip including a rear face to be mounted on a substrate and a front face. A substrate configured to hold the semiconductor chip is also produced. The semiconductor chip is held by a bonding tool including a bonding head, and with the front face of the semiconductor chip resting on the surface of a pressure plate of the bonding head. The rear face of the semiconductor chip is then pressed onto the substrate with any curvature of the surface of the pressure plate being matched to any curvature of the substrate, and the rear face of the semiconductor chip is connected to the substrate.

In one embodiment, the curvature of the surface of the pressure plate and the curvature of the substrate are essentially the same throughout the entire duration of the pressing process. Before or after the semiconductor chip is picked up, but before the semiconductor chip is pressed onto the substrate, the pressure plate is preformed, by applying a suitable voltage, such that its curvature corresponds to that of the substrate.

Alternatively, it is also possible for the magnitude of the radius of curvature of the surface of the pressure plate at the start of the pressing process to be greater than the radius of curvature of the substrate, to decrease during the course of the pressing process, and to be essentially of the same magnitude as that of the substrate at the end of the pressing process. During this procedure, the semiconductor chip is first of all curved only slightly (or not at all), its central area is placed on the substrate, and is fitted to the substrate during the bonding process by a "rolling" process outwards, by varying the voltage over time. This procedure is possible when the substrate is curved upward.

However, when the substrate is curved downward, so that it has a "trough" in the area which is intended to hold the central area of the semiconductor chip, the opposite procedure can be adopted. In this embodiment, the magnitude of the radius of curvature of the surface of the pressure plate at the start of the pressing process is less than the radius of curvature of the substrate, decreases during the course of the pressing process, and is essentially of the same magnitude as that of the substrate at the end of the pressing process.

Since the curvatures of the pressure plate as well as the semiconductor chip and substrate are the same at least at the end of the pressing process, this ensures that the semiconductor chip can be uniformly connected to the substrate.

Exemplary embodiments are now described in further detail with respect to the figures.

FIG. 1 shows a bonding head 1 of a bonding tool (which is not illustrated in any further detail for ease of illustration) with a pressure plate 2. The pressure plate 2 is composed of a piezoceramic material and can be curved by a voltage supply (which is not illustrated in any further detail for ease of illustration). The pressure plate 2 has a surface 3 which is configured to hold a semiconductor chip 4.

In order to mount the semiconductor chip 4 on a substrate 8, the semiconductor chip 3 is picked up from a sawing film, for example, by the bonding head 1. In this case, the semiconductor chip 3 can be picked up by sucking it up. For this purpose, in its interior, the bonding head has an axial hole 7 through which a reduced pressure can be applied to the surface 3 of the pressure plate 2.

The semiconductor chip 4 is sucked up by the bonding head in order to fit it to an area 11, provided as a chip island, on the substrate 8, and its front face 6 comes to rest on the surface 3 of the pressure plate 2. The semiconductor chip 4 is then positioned above the area 11 of the substrate 8, and its rear face 5 is pressed onto the substrate 8.

Figure 2:
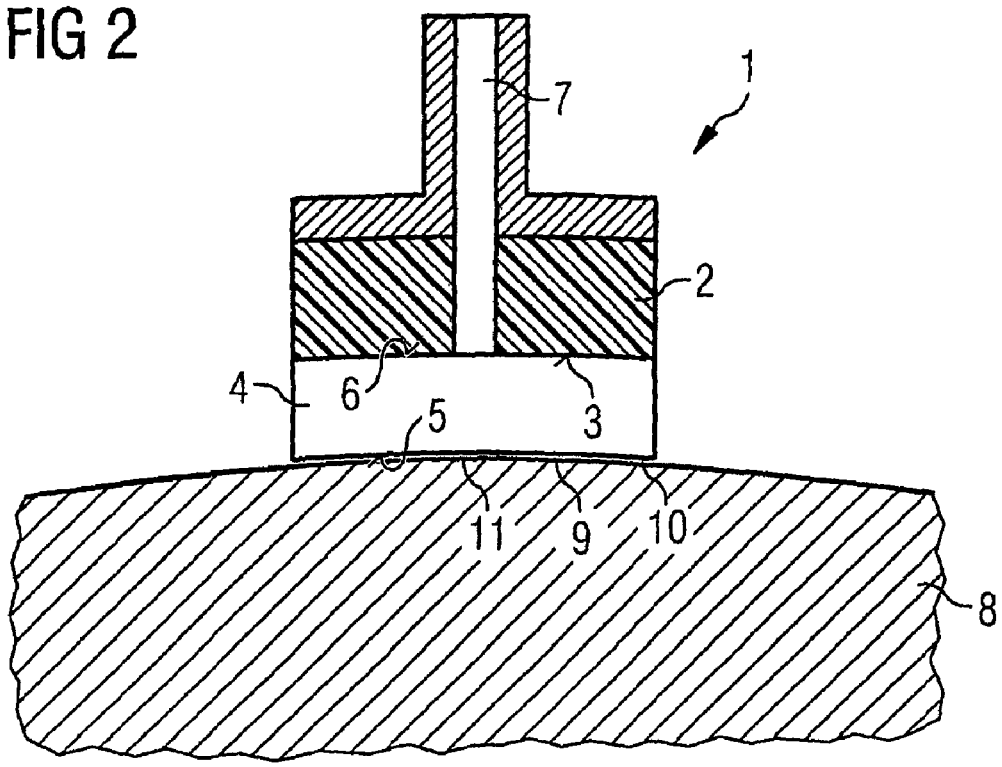
FIG. 2 shows a schematic cross section through the bonding head shown in FIG. 1, with a curved pressure plate.

As is illustrated in FIGS. 1 and 2, it is possible to initially fit the semiconductor chip 4 only in a central area 9 of the domed or curved substrate 8. For this purpose, the pressure plate 2 and thus the semiconductor chip 4 have a radius of curvature which, in the case of the curvature of the substrate 8 shown in FIG. 1, is greater than the radius of curvature of the substrate 8. In other words, the pressure plate 2 and the semiconductor chip 4 may be curved to a lesser extent at the start of the pressing process than the substrate 8.

FIG. 2 shows a further step in this method. In order to achieve a uniform contact pressure for the semiconductor chip 4 and thus a reliable, uniform connection between the semiconductor chip 4 and the substrate 8, the pressure plate 2 and the semiconductor chip 2 are subsequently curved to a greater extent, so that the semiconductor chip 2 is rolled on the substrate 8. At the end of the pressing process, the radius of curvature of the pressure plate 2 and therefore of the semiconductor chip 4 as well is equal to the radius of curvature of the substrate 8. This means that the radius of curvature of the pressure plate is varied over time during this "dynamic bonding" process.

However, the substrate 8 may also be curved in the other direction from that illustrated in the figures. In this case, it would be advantageous for the pressure plate 2 and therefore the semiconductor chip 4 to have a radius of curvature during the dynamic bonding process which is less than the radius of curvature of the substrate 8. In this case as well, the semiconductor chip 2 is rolled on the substrate 8.

However, a "static bonding" process can also be carried out using the bonding head 1 according to the invention. For this purpose, the curvature of the pressure plate 2 is matched to the curvature of the substrate 8 before or after the semiconductor chip 4 is picked up, but in any case before the start of the pressing process, that is to say before the chip rear face 5 touches the substrate 8. This allows a uniform contact pressure to be achieved for the semiconductor chip 4, even in its edge areas 10, without any rolling process, thus allowing a uniform soldered, adhesively-bonded or sintered joint to be produced between the semiconductor chip 4 and the substrate 8.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

The invention claimed is:

1. A method for producing a device, comprising:
    holding a component with a bonding tool, wherein the component includes a rear surface to be mounted on a substrate and a front surface, the bonding tool comprises a bonding head including a pressure plate with a holding surface, and the front surface of the component is held to the holding surface of the pressure plate;
    pressing the rear surface of the component onto a surface of the substrate, wherein the surface of the substrate has a curvature, and the holding surface of the pressure plate is provided with a curvature that matches the curvature of surface of the substrate, and the curvature of the holding surface of the pressure plate is configured to be changed so as to change the curvature of the rear surface of the component when the component is held by the bonding tool; and connecting the rear surface of the component to the surface of the substrate.

2. The method of claim 1, wherein the component comprises a semiconductor chip.

3. The method of claim 1, wherein the curvature of the holding surface of the pressure plate and the curvature of the surface of the substrate are substantially the same throughout the duration of the pressing process.

4. The method of claim 1, wherein a magnitude of the radius of curvature of the holding surface of the pressure plate at the start of the pressing process is greater than the radius of curvature of the surface of the substrate, and the radius of curvature of the holding surface decreases during the pressing process so as to be substantially the same as the radius of curvature of the surface of the substrate at the end of the pressing process.

5. The method of claim 1, wherein the pressure plate comprises a piezoceramic material.

6. A method for producing a device, comprising:

holding a component with a bonding tool, wherein the component includes a rear surface to be mounted on a substrate and a front surface, the bonding tool comprises a bonding head including a pressure plate with a holding surface, and the front surface of the component is held to the holding surface of the pressure plate;

pressing the rear surface of the component onto a surface of the substrate, wherein the surface of the substrate has a curvature, the holding surface of the pressure plate is provided with a curvature that changes to match the curvature of surface of the substrate; and connecting the rear surface of the component to the surface of the substrate, wherein the rear surface of the component changes as the curvature of the holding surface of the pressure plate changes such that the rear surface of the component is rolled onto the surface of the substrate.

* * * * *